United States Patent [19]

Yamane et al.

[11] Patent Number: 4,914,488

[45] Date of Patent: Apr. 3, 1990

[54] COMPOUND SEMICONDUCTOR STRUCTURE AND PROCESS FOR MAKING SAME

[75] Inventors: Masao Yamane, Kokubunji; Tomoyoshi Mishima, Shiki; Shigeo Goto, Kokubunji; Susumu Takahashi; Makoto Morioka, both of Tokyo, all of Japan

[73] Assignee: Hitachi, Ltd., Tokyo, Japan

[21] Appl. No.: 189,179

[22] Filed: May 2, 1988

Related U.S. Application Data

[63] Continuation-in-part of Ser. No. 60,606, Jun. 11, 1987.

[51] Int. Cl.$^4$ ............................................. M01L 27/12
[52] U.S. Cl. ......................................... 357/4; 357/16; 357/22
[58] Field of Search .................... 357/4, 4 SL, 22, 16, 357/22 I

[56] References Cited

U.S. PATENT DOCUMENTS 4,794,611 12/1988 Hara ................................. 357/4 X 4,819,036 4/1989 Kuroda .

Primary Examiner—Martin H. Edlow
Attorney, Agent, or Firm—Antonelli, Terry & Wands

[57] ABSTRACT

A compound semiconductor structure in the form of a superlattice film with effectively graded average composition, comprising an alternating lamination of two kinds of layers of different composition to form pairs of layers, the ratio of the thickness of one layer to the thickness of the other in said pairs of layers being gradually varied in the direction of thickness throughout successive pairs, thereby the average composition being effectively graded throughout the pairs. In a heterojunction field effect transistor, the layer of effectively graded composition is used between a semiconductor layer making low resistance contact with a current-supplying electrode and a semiconductor layer where a two dimensional channel is to be formed. In case of AlGaAs/GaAs system, the Al composition is varied. When the superlattice film is heat-treated, Al in the AlGaAs layer diffuses into the GaAs layer, yielding a film with actually smoothly graded Al mole fraction.

19 Claims, 6 Drawing Sheets

COMPOUND SEMICONDUCTOR STRUCTURE AND PROCESS FOR MAKING SAME

CROSS REFERENCE TO RELATED APPLICATION

This application is a continuation-in-part application of a U.S. patent application, Ser. No. 07/060,606, filed on June 11, 1987 entitled "COMPOUND SEMICONDUCTOR STRUCTURE HAVING GRADED MOLE FRACTION AND PROCESS FOR PREPARATION THEREOF".

BACKGROUND OF THE INVENTION

1. Field of the Invention

This invention relates to a compound semiconductor structure and a process of making the same, and more particularly to a compound semiconductor structure having a graded composition or mole fraction adapted for reducing the source resistance in a hetero-junction field effect transistor and a process of making the same.

2. Description of the Related Art

Applications of compound semiconductors involve the hetero-junction field effect transistor (HJ-FET). An example of the prior art of HJ-FET is shown in FIG. 6.

An undoped GaAs layer 2 is formed on a semi-insulating GaAs substrate 1. An undoped $Al_{0.3}Ga_{0.7}As$ layer 3 is formed on the undoped GaAs layer 2 to form a hetero-junction. Due to the difference in the electron affinity in the materials GaAs and $Al_{0.3}Ga_{0.7}As$, there are formed steps $\Delta E_c$ and $\Delta E_v$ in the conduction band energy and the valence band energy, respectively, at the $Al_{0.3}Ga_{0.7}As/GaAs$ hetero-junction interface. A quantum potential well originating in the gap of the conduction bands, $\Delta E_c$, is formed in the undoped GaAs layer 2 adjacent the hetero-junction interface and results in the yielding of a two dimensional electron gas (2DEG), that is supplied from the donor in n-$Al_{0.3}Ga_{0.7}As$ layer, by means of ionizing. 2 DEG in its quantum potnntial well should contribute as a channel of the HJ-FET.

On the channel region constituted by the undoped $Al_{0.3}Ga_{0.7}As$ layer 3 and the undoped GaAs layer 2, are formed graded mole fraction layers 22 and 23 of $Al_xGa_{1-x}As$ sandwiched between uniform composition layers 21 and 24 of undoped GaAs and n type doped $Al_{0.3}Ga_{0.7}As$. The graded mole fraction layers 22 and 23 have a composition distribution in which the Al mole fraction x of $Al_xGa_{1-x}As$ changes from 0 to 0.3 as the position goes from the upper surface of the layer 22 to the lower surface of the layer 23, as shown at right hand side portion of FIG. 6. Thus, with respect to the Al mole fraction, the graded composition layers 22 and 23 connect the undoped GaAs layer 21 and the undoped $Al_{0.3}Ga_{0.7}As$ layer continuously.

The layers 21 and 22 disposed below the gate electrode 9 are undoped to prevent the excessive increase in the field intensity, which may lead to avalanche breakdown.

Electrons are supplied from the source electrode 8 to the channel region 2, 3 through the layers 21, 22, 23 and 24. Electrons are transported through the channel formed by the hetero-junction layers 2 and 3 in the form of a two dimensional electron gas, whose electron number could be controlled by the voltage of a gate electrode. And those are derived through the layers 21, 22, 23 and 24 to the drain electrode 10. The source and drain electrodes 8, 10 may be formed of Au/Ni/AuGe and makes an Ohmic contact with the alloy under the condition of 400° C. for 2 minutes. The gate electrode 9 may be formed of Al and established using the usual lift-off process.

FIG. 7 shows a band diagram in the HJ-FET of FIG. 6 in a direction perpendicular to the substrate surface (i.e. in the depthwise direction). The left end, i.e. outer left, region represents the surface GaAs region 21. The flatness of the diagram in this region means the state under the no electric field. In the case of the flowing electrons, of course, the band diagram should be inclined to right hand side. The inner left region, next to the surface GaAs region 21, represents the graded composition regions 22 and 23. The region 22 is undoped for providing a high breakdown voltage, as described above.

When the source electrode 8 is biased slightly negatively with respect to the channel region 2, electrons will flow from the source 8 to the channel 2 with a low resistance. The inner right region represents the n-type $Al_{0.3}Ga_{0.7}As$ region 24 and the undoped $Al_{0.3}Ga_{0.7}As$ region 3. In the right-hand side of these region 24, 3, the bands are bent upward due to the ionization of donor in n-type $Al_{0.3}Ga_{0.7}As$ region 24. The right end i.e. the outer right region, represents the undoped GaAs region 2. Due to the differences in the energy of the conduction band and the valence band with respect to the vacuum level, there are generated gaps $\Delta E_c$ and $\Delta E_v$ in the bottom of the conduction band $E_c$ and in the top of the valence band $E_v$, respectively.

If the graded composition region 22 and 23 is not provided that is, Al mole fraction of x is 0.3 in the regions, similar gaps may be formed at the interface between the surface GaAs region 21 and the $Al_{0.3}Ga_{0.7}As$ above said region in the case of no graded one. The graded composition region 22, 23 serves to connect the bottom of the conduction band $E_c$ continuously, thereby enhancing transport of the charge carrier, electrons. This structure is reported, for example, in IEEE Transactions on Electron Devices, Vol. ED-33, No. 5 (1986) pp. 601–607.

Conventionally, the graded composition layer as described was formed through crystal growth by the molecular beam epitaxy (MBE), by changing the temperature of an aluminum cell during the growth to vary the Al mole fraction x of $Al_xGa_{1-x}As$ from 0.3 to 0.0.

Generally, one of the features of the MBE epitaxial growth of a compound semiconductor crystal is that the vapor pressures of atoms, and hence the rate of crystal growth, are regulated by controlling the temperatures of molecular beam sources. In the MBE epitaxial growth of a compound semiconductor, the constituent atoms of the compound are fed in the form of vapor into an ultrahigh vacuum space from two or more molecular beam sources and are solidified, in the form of an epitaxial crystal, on a semiconductor substrate crystal placed on a temperature-controlled susceptor, wherein the axes of the grown crystal follow those of the substrate crystal. The composition or mole fraction of the crystal to be grown, for example, x of $Ga_xAl_{1-x}As$, is determined by setting each vapor pressure of the molecular beam sources, Ga, Al and As. The vapor pressure of each source only depends upon the cell temperature of above said source. Thus, for making a crystal having a graded mole fraction x, it is necessary to vary the cell temperature of source to be varied. Conventionally, for grading a mole fraction x from a higher value toward a lower value, natural cooling has been utilized by switching off the electric power source which is the heat source for the cell of the atom concerned. Vapor pressure changes exponentially with temperature. Stable temperature control (for example of the order of ±0.1° C.) is required for providing an accurate vapor pressure. For realizing a smooth composition distribution, it is preferable to gradually change the temperature. Thus, natural cooling has been adopted. FIG. 3 represents the relationship between the Al mole fraction of an $Al_xGa_{1-x}As$ crystal and the film thickness of the crystal grown under natural cooling of the Al cell. Initially, the respective cell temperatures are set to grow $Al_{0.3}Ga_{0.7}As$. The heater of the Al cell is turned off to allow the Al cell to be cooled naturally. As the temperature of the Al cell decreases, the Al vapor pressure decreases, after the relation $P_{Al} \propto \exp(-\Delta E_{Al}/kT_{Al})$, where $\Delta E_{Al}$ is the activation energy of Al and $T_{Al}$ is the Al cell temperature, resulting in gradual decrease in the composition $x$ of the grown $Al_xGa_{1-x}As$ layer. As the value of $x$ becomes small, the variation becomes gentle.

When the quantity of As vapor is sufficient, the composition $x$ of the grown layer $Al_xGa_{1-x}As$ is determined by the vapor pressures of aluminum $P_{Al}$ and gallium $P_{Ga}$. The growth rates are set, for example, $$v_{GaAs} = 1 \ \mu m/hr \approx 2.8 \ \text{Å/sec}$$

$$v_{Al_{0.3}Ga_{0.7}As} = 1.43 \ \mu m/hr \approx 4.0 \ \text{Å/sec}.$$

Here, the well temperatures of Ga and Al are set at $T_{Ga}=983°$ C. and $T_{Al}=1090°$ C. The growth rate of $Al_{0.3}Ga_{0.7}As$ is the sum of the growth rates of GaAs 1 $\mu m/hr$, and of AlAs, 0.43 $\mu m/hr$. Letting the growth rate of AlAs be $y$ $\mu m/hr$, the composition $x$ will be $$x = \frac{y}{1+y}.$$

The growth rate of AlAs is $$y = \frac{x}{1-x}.$$

When the Al cell temperature is 1090° C. (=1363° K.) in the growth of $Al_{0.3}Ga_{0.7}As$, the growth rate of AlAs can be expressed as $$y = 0.429 \exp[(-\Delta E_{Al}/k)(1/T_{Al} - 1/1363)].$$

Ordinary natural cooling requires about 30 seconds for lowering the Al cell temperature $T_{Al}$ by 100 degrees. For allowing the composition $x$ to change from 0.3 to 0.0, it is necessary to grow a graded layer of the order of 400 Å thick.

The crystal growth by MBE as described above is discussed in K. Takahashi, "Molecular Beam Epitaxy Technique" (1984) published by Kogyo Chosakai.

This conventional technique utilizing the natural cooling is useful for varying the mole fraction of an epitaxial crystal within a thickness of several hundreds of nm. Because of a relatively long growth time, the temperature can be lowered sufficiently. Thus, it was possible to vary, for example, the Al mole fraction $x$ of $Al_xGa_{1-x}As$ from $x=0.3$ to $x=0$. However, in forming a thin film of around several tens of nm, the change in mole fraction from $x=0.3$ to $x=0$ was difficult owing to a too small growth time to cause sufficient temperature lowering.

It is indeed possible, to forcedly control the cell temperature by heating, etc. For example in the growth of $Al_xGa_{1-x}As$ by MBE, when the temperature of the Al cell is raised, the pressure of Al vapor varies in accordance with the instantaneous temperature of the Al cell, and hence the growth rate of the $Al_xGa_{1-x}As$ crystal varies. In such cases, control of the film thickness and the doping concentration becomes very difficult. This is because rapid temperature changes in a practical cell is hardly monitored accurately even when a thermo-couple thermometer is disposed near the cell for detecting the temperature and effecting temperature control. Thus, reproducibility and stability have been problematic.

A kind of superlattice structure as shown in FIG. 4 was proposed. The film thickness A of one kind of layer containing the element (Al in this case) and the film thickness B of another kind of layer which does not contain the element (Al) are set equal to each other (A=B). The sum of the thicknesses of adjacent pair of films (A+B) is increased. In FIG. 4, there is shown the relationship between the Al mole fraction and the epitaxial crystal thickness (proportional to the time of growth). The solid line represents the Al mole fraction of the grown film and the broken line represents the average mole fraction. This technique is described in Electronics Letters, 21, pp. 882–884 (1985).

U.S. Pat. No. 4,620,206 to Ohta et al (corresponding to JP-A-60-28268) discles a negative resistance device formed with a superlattice. Typically, a superlattice layer C is formed between material A layer and material B layer. In the superlattice, one end portion contacting the material A layer has properties substantially identical to material B and the other end portion contacting the material B layer has properties substantially identical to material A. A negative resistance phenomenon is exhibited, using above said structure involving homogeneous materials A and B and super-lattice. Here, if material A is exchanged by material B, and also B by A, the negative resistance phenomenon can not be observed in principle.

SUMMARY OF THE INVENTION

An object of this invention is to provide a compound semiconductor structure having a layer of effectively graded composition, using superlattice layers.

Another object of this invention is to provide a hetero-junction field effect transistor having a structure for reducing the source resistance.

Further object of this invention is to provide a process for growing a crystal layer of an effectively graded composition without any problem in reproducibility and stability.

According to one aspect of this invention, a crystal layer of an effectively graded composition is realized by a superlattice layer formed of ultrathin films of two kinds of material, one having a composition larger than a desired composition and the other having a composition smaller than the desired composition.

When the interval of the superlattice is smaller than the quantum mechanical spreading of the wave function of an electron in the semiconductor, the potential which an electron senses is an average of the potential distribution over those layers of the superlattice which are located within the spreading of the wave function of the electron. In such a case, approximation can be made that the average composition will mainly control the average potential which the electron senses. Then, a superlattice structure having a graded average composition can be equivalent to a continuous layer having a graded composition for an electron. This holds true when there is no intense field in the superlattice structure and no influence of the forbidden band of the superlattice on the electrons.

In the superlattice structure comprising repeated pairs of superthin films, there can be established subband structure which extends throughout the superlattice, when the thickness of each pair of superthin layers is less than the dimension of an electron cloud.

It is possible to connect two layers of different composition with a superlattice which has an average composition distribution changing from one to the other of the different compositions of the two layers, to realize a gradual change of the potential for an electron in the band structure, as the sub-band of superlattice. More specifically, ratio A/B of the thickness A of the ultrathin film of a first composition material to the thickness B of the ultrathin film of a second composition material, is varied stepwise along with the successive deposition of the ultrathin films for forming a superlattice structure. The average composition at each end of the superlattice is approximately equal to the composition of the neighboring homogeneous layer. Thus, there can be provided a compound semiconductor structure including a pair of outer layers and an intervening superlattice layer and having an effectively graded composition from one outer layer to the other outer layer.

According to another aspect of this invention, there is provided a process for making a compound semiconductor structure by MBE, which structure contains at least three constituent elements and has a graded composition distribution with respect to at least two of said constituent elements. Two or more sets of molecular beam sources having different mole fractions of elements are used to alternately laminate superthin epitaxial layers while successively varying the thickness ratio of the pair of adjacent superthin layers to establish effectively graded mole fraction. According to another aspect of this invention, there is also provided a compound semiconductor structure having effectively smoothly graded mole fraction produced by the above process. In this process, while varying the ratio (A/B) of the thickness A of a layer containing the element whose mole fraction is being varied to the thickness B of another layer not containing said element, superthin layers are grown one upon another to construct a superlattice structure of compound semiconductor having effectively graded mole fraction.

In an embodiment, a first sub-band of the superlattice layer where electrons can exist smoothly connects the conduction bands of the two materials of the layers sandwiching the superlattice layer.

In another embodiment, after a superlattice structure has been made, the superlattice structure is subjected to annealing, in which the films constituting the superlattice cause mutual diffusion, thereby transforming the superlattice into a continuous layer.

A compound semiconductor structure of a thin layer shape of the order of tens of microns and having an effectively largely varying composition can be made utilizing the MBE technique. When such a semiconductor structure is adopted in a hetero-junction semiconductor device such as a hetero-junction field effect transistor, reduction in the parasitic source resistance and hence an improvement in performance can be attained.

Since a semiconductor structure capable of reducing the source resistance of a hetero-junction field effect transistor can be made by the MBE with all the cell temperatures kept constant, good controllability and stability in the film thickness and the doping level can be provided to enable easy fabrication of a high performance semiconductor device.

When natural cooling is combined with the abovementioned technology, further rapid and smooth change in the effective composition or the effective band structure can be provided.

DESCRIPTION OF THE PREFERRED EMBODIMENTS

Figure 1:
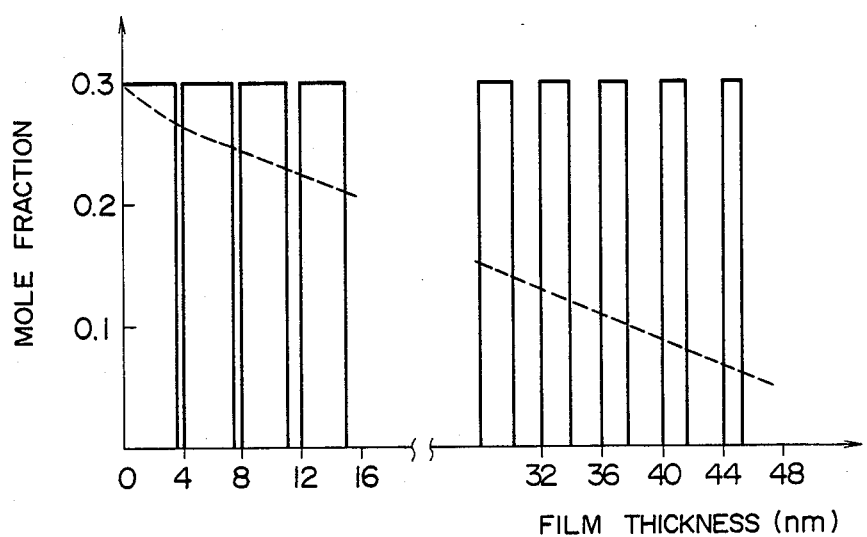
FIG. 1 is a graph showing a composition distribution in a superlattice structure in the direction of film thickness, according to an embodiment of this invention.

FIG. 1 represents the relation between the mole fraction and the thickness of the film having a superlattice structure formed by depositing superthin layers while gradually decreasing the thickness ratio $d_A/d_B$, where $d_A$ is a thickness of each material A film and $d_B$ is a thickness of each material B film, and the superlattice is constituted in a form of (ABAB . . . AB). Materials A and B are exemplified to have compositions $x=0.3$ and $x=0.0$. For example, A is $Al_{0.3}Ga_{0.7}As$ and B is $Al_{0.0}Ga_{1.0}As$. The solid line represents the mole fraction distribution in the as-grown film. The thickness ratio $d_A/d_B$ and the average composition may be defined by considering each material A film and a succeeding material B film as a pair. As shown by the broken line, the average mole fraction decreases with the increase in film thickness, resulting in graded mole fraction.

In a superlattice formed of a lamination of ultrathin films, a sub-band structure is established, which extends over the lamination, depending on the properties of the materials constituting the superlattice, the thicknesses of the respective films, etc. By selecting the conditions appropriately, an electronic state similar to that of a continuous bulk crystal having a graded composition can be obtained in a superlattice region having a average composition within the region of spreading of an electron wave function to be graded.

The superlattice structure can be subjected to annealing, e.g. rapid annealing which is a high temperature annealing in such a short period as several tens of seconds or below, to cause thermal diffusion of the constituent elements. By the diffusion of the element or elements which establish the repeatedly varying composition distribution of the superlattice, the composition distribution can be smoothened. The superlattice structure can be transformed to a continuous structure of a graded composition. By such diffusion of constituent element or elements, the composition itself will have a distribution as shown by a broken line in FIG. 1, to provide a layer having an actually smoothly varying graded composition.

This invention is a course adaptable widely to polyatomic compounds such as, for example, $In_xGa_{1-x}As$, $InAs_xP_{1-x}$, $In_xGa_{1-x}As_yP_{1-y}$, $In_xAl_{1-x}As$, $In_xAl_{1-x}P$ and others, by selecting the number of cells and appropriate source materials.

The epitaxial crystal growth by MBE can control the film thickness on the order of monoatomi layer. Thus, it is possible to grow an Al compound crystal with Al mole fraction being varied. When the composition is constant, continuous growth can be carried out in a usual manner on a lattice-matched underlie crystal. Here, description will be made on a case in which, between an $Al_xGa_{1-x}As$ layer and an $Al_yGa_{1-y}As$ layer, a graded composition layer having a composition varying from x to y ($1 \geq y \geq 0$) is formed. As a specific case, a case of $x=0.3$ and $y=0$, as shown in FIG. 1, will be described.

The MBE apparatus to be used may be an ordinary one having a crystal growth chamber of ultrahigh vacuum. The semiconductor compound exemplified in this Example is $Al_xGa_{1-x}As$. Four cells of Ga, As, Al and Si are used as molecular beam sources.

After a substrate is accommodated on a receptor, the temperatures of the substrate and cells of Al, Ga and As are set at such levels that the Al mole fraction x of an $Al_xGa_{1-x}As$ crystal to be grown is 0.3, i.e. $Al_{0.3}Ga_{0.7}As$.

For example, the As cell is kept at a sufficiently high temperature to supply sufficient As vapor, the Al cell and the Ga cell are kept at 1090° C. and 983° C. respectively to supply Al/Ga vapors which will form a mixed crystal $Al_{0.3}Ga_{0.7}As$. The growth rate is, for example 1.43 μm/hr. The growth is initiated by opening the shutters of the cells, after the substrate is heated to a predetermined temperature. A layer of uniform composition $Al_{0.3}Ga_{0.7}As$ is first grown.

Then, a first layer of the superlattice, i.e., $Al_{0.3}Ga_{0.7}As$ of a controlled thickness (FIG. 1, left end layer) is grown. Up to this point, the shutter of the Al cell has been kept open. In the stage of growing a region having a varying effective Al mole fraction from 0.3 to 0, the shutter of the Al cell is closed for successively longer periods to decrease the Al composition. Taking a unit time span to be 20 seconds, for instance, the Al cell is open for 19 seconds during the first period of 20 seconds, then for 18 seconds during the second period of 20 seconds, and so on so that the quantity of Al, and hence the average Al mole fraction in the pair of layers grown in 20 seconds shall steadily decrease. Finally, the shutter of the Al cell is closed for the full period of 20 seconds.

In FIG. 1, unit time interval is selected to grow a pair of layers with a sum thickness of 4 nm. The pair of layers have compositions $x=0.3$ and $x=0.0$. The average composition is determined by the thickness ratio of the two layers.

Under a certain schedule, the thickness ratio of layers is gradually changed to realize gradual decrease of the average composition.

Under consideration of the dimension of an electron cloud, the thickness of a monoatomic layer and the rate of crystal growth, the time span may be adjusted so as to obtain gradually varying graded average mole fraction, distribution of which is equivalent to a really smoothly graded composition distribution.

The spreading of an electron wave function in semiconductors is of the order of 80 Å, although it depends on the kind of semiconductor, the degree of crystallinity, etc. The interval of the superlattice structure is preferably small for avoiding variations in the potential which may cause scattering from the state moving the electron in a direction perpendicular to the superlattice to other states.

In the regions wherein the time length of open shutter and that of closed shutter become approximately equal, it is effective for making the potential of the sub-band to change smoothly as possible to decrease the unit time span.

For growing doped films, the Si cell is kept at a constant temperature with the shutter kept open so as to achieve a prescribed doping level.

The shutter can of course be closed when an undoped $Al_xGa_{1-x}As$ layer with graded Al mole fraction is to be grown.

Figure 5A:
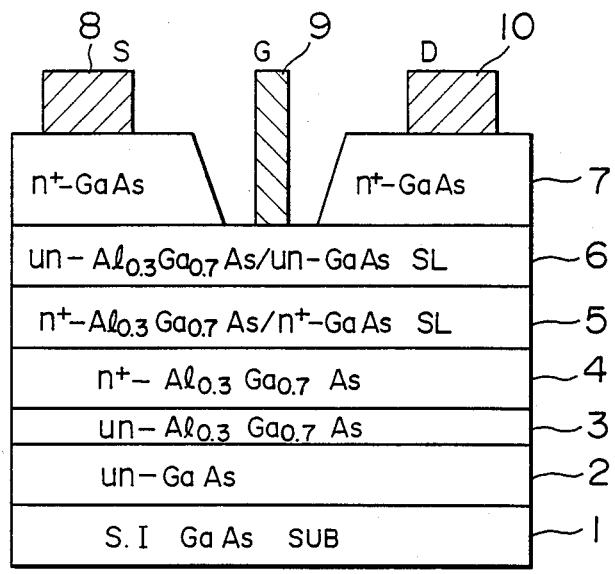
FIG. 5A is a cross-sectional view of a heterojunction field effect transistor according to embodiment of this invention.

Now, an example of a semiconductor device will be described referring to FIGS. 5A and 5B. As shown in FIG. 5A, on a semi-insulating GaAs substrate 1, an undoped GaAs layer 2 having a thickness of 5000 Å, an undoped $Al_{0.3}Ga_{0.7}As$ layer 3 having a thickness of 20 Å, an n+-type $Al_{0.3}Ga_{0.7}As$ layer 4 having a Si concentration of $2.3 \times 10^{18}$ cm$^{-3}$ and a thickness of 100 Å, an n+-type-$Al_{0.3}Ga_{0.7}As$/n+-type GaAs superlattice layer 5 having a Si concentration of $2.3 \times 10^{18}$ cm$^{-3}$ and a thickness of 150 Å, an undoped $Al_{0.3}Ga_{0.7}As$/undoped GaAs superlattice layer 6 having a thickness of 100 Å, and an n+-type GaAs layer 7 having an impurity concentration of $3.5 \times 10^{18}$ cm$^{-3}$ and a thickness of 1600 Å are successively epitaxially grown. Similar to the conventional device shown in FIG. 6, the heterojunction between the $Al_{0.3}Ga_{0.7}As$ layer 3 and the GaAs layer 2 establishes a two-dimensional electron gas channel.

In forming the superlattice structures, the cell temperatures of Al, Ga and As are kept respectively constant. Doping is controlled by opening or closing the shutter of Al cell. Thus, the stability and the controllability of the growth rate and the doping level are very good, as being similar to the usual bulk growth by MBE.

Figure 8A:
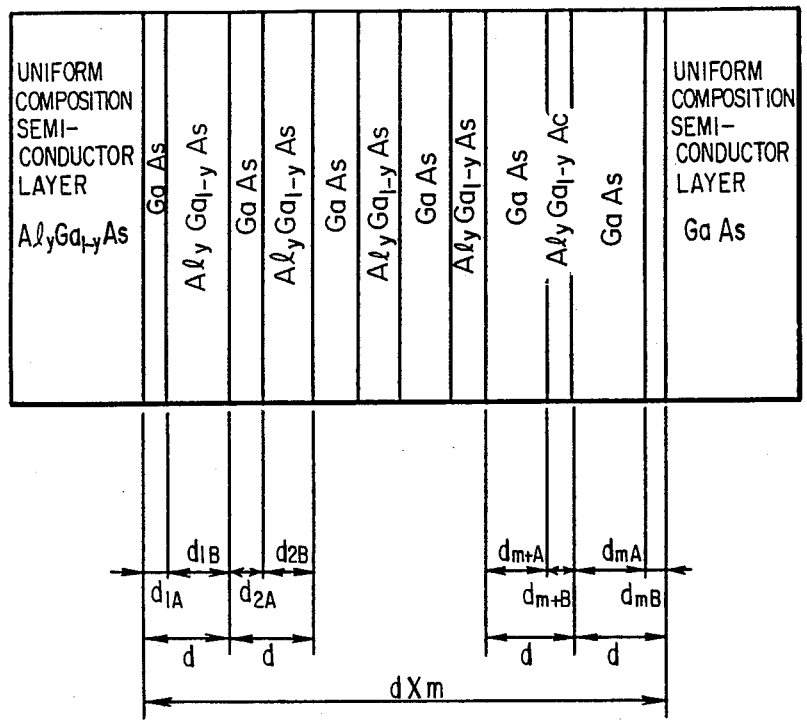
FIG. 8A is a diagram illustrating a superlattice structure sandwiched between a pair of uniform composition semiconductor layers.
Figure 8B:
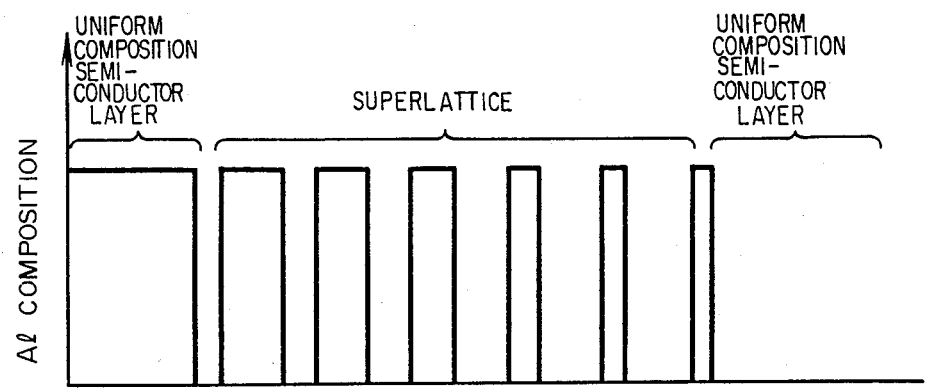
FIG. 8B is a graph showing the distribution of Al composition y in the direction of the film thickness in the superlattice structure and two kinds of uniform composition semiconductor layers of FIG. 8A.
Figure 8C:
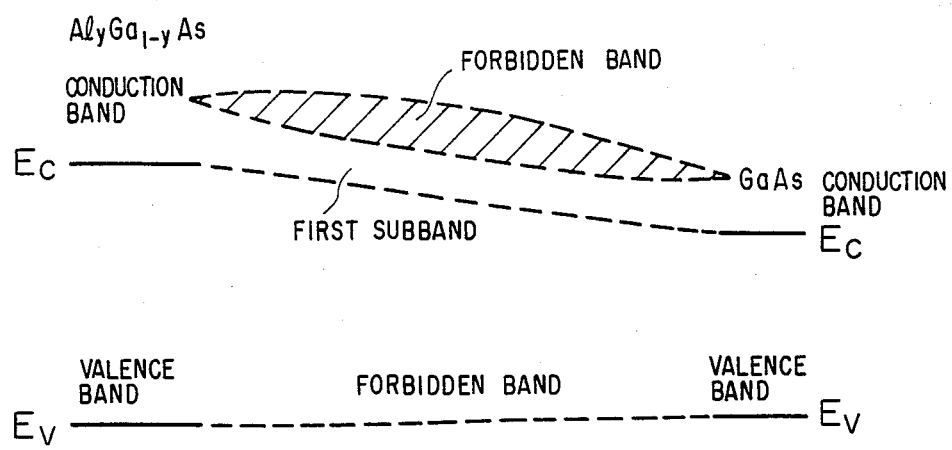
FIG. 8C is a band diagram showing the subbands in the superlattice structure and the bands in the uniform composition semiconductor layers sandwiching the superlattice structure of FIG. 8A.

The GaAs/AlGaAs superlattice is formed by alternately growing $Al_yGa_{1-y}As$ (y>0) layers and GaAs layers. As shown in FIG. 8A, taking adjacent layers of $Al_yGa_{1-y}As$ and GaAs as a unit, m units of $Al_yGa_{1-y}As$/GaAs layers are laminated to form a superlatice. The thickness of the $Al_yGa_{1-y}As$ layer in the j-th unit is denoted as $d_{jA}$, and the thickness of the GaAs layer in the j-th unit is denoted as $d_{jB}$. FIG. 8B schematically illustrates the actual variation of the Al composition in the superlattice structure. The sum of the layer thicknesses in each unit, $d_j = d_{jA} + d_{jB}$, is kept constant, and the ratio of the $Al_yGa_{1-y}As$ layer thickness $d_{jA}$ to the sum thickness $d_j$ is gradually changed from 1 to 0, between uniform composition layers of $Al_yGa_{1-y}As$ and GaAs. FIG. 8C illustrates the relation of the sub-band structure in the superlattice and the conduction band structures of $Al_yGa_{1-y}As$ and GaAs uniform composition layers. Thus, it is made possible to set the energy of the first sub-band in the superlattice structure to smoothly vary from the conduction band energy of $Al_yGa_{1-y}As$ to the conduction band energy of GaAs. For making a superlattice structure of small resistance, the sum thickness $d_j$ of layers in each unit is selected preferably not more than about 4 nm.

Figure 5B:
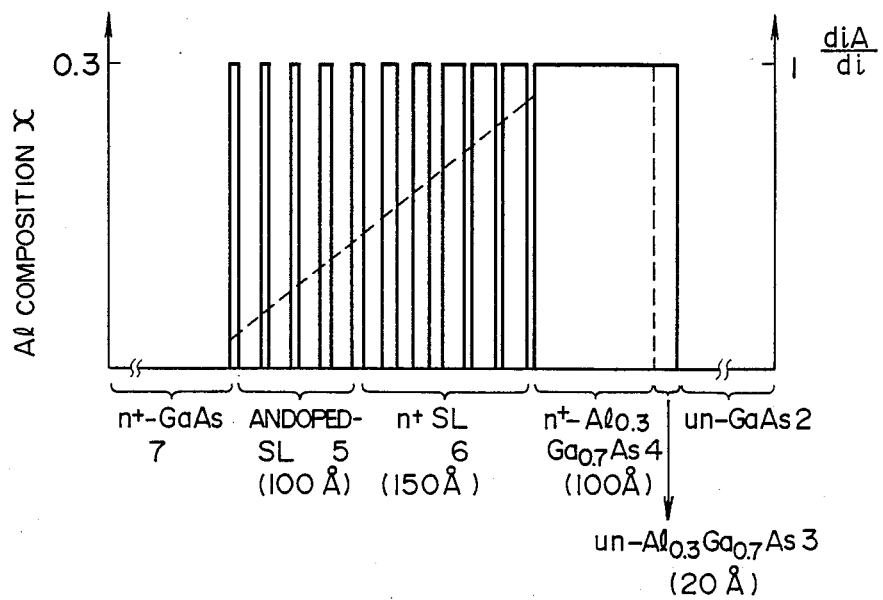
FIG. 5B is a graph of the Al composition x and the thickness ratio of one kind of film in each pair of films, with respect to the depth or thickness in a main part of the HJ-FET of FIG. 5A.
Figure 6:
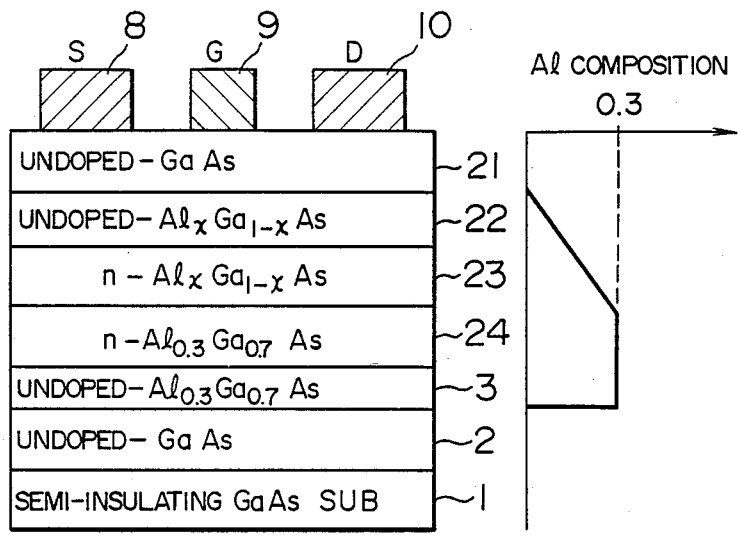
FIG. 6 is a cross-sectional view of a heterojunction field effect transistor according to the prior art.
Figure 7:
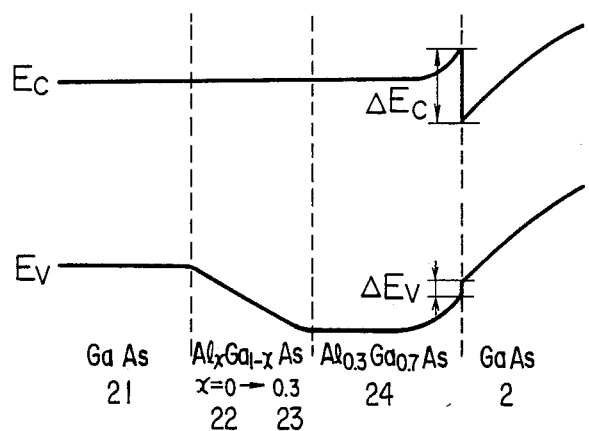
FIG. 7 is a band diagram in a main part of the HJ-FET of FIG. 6.

In an example, the sum thickness of layers in each unit was set at 2.5 nm, $d_j = d_{jA} + d_{jB} = 2.5$ nm, and the ratio of the $Al_{0.3}Ga_{0.7}As$ layer to the unit thickness, $d_{jA}/d_j$ was gradually varied from 1 to 0 as schematically illustrated in FIG. 5B. In FIG. 5B, crystal growth proceeds from the right hand side to the left hand side.

After the crystal growth, an ordinary mesaetching process for an electric isolation, formation of source and drain electrodes by lift-off process, and formation of a gate electrode are carried out to form a hetero-junction field effect transistor as shown in FIG. 5A.

The two dimensional electron gas channel formed in the GaAs layer 2 adjacent the hetero-junction is connected to the source/drain electrodes through the superlattice layer 5 and 6 sandwitched between uniform composition layers 4 and 7. The uniform composition layer 7 is heavily doped to form low resistance Ohmic contacts with the source/drain electrodes 8 and 10. A latter part of the superlattice layer is undoped to relax the field intensity below the gate electrode 9.

Although the superlattice structure was formed of $Al_yGa_{1-y}As$ layers where y=0.3 and GaAs layers in the above description, the end composition is not limited to 0.3. In ordinary cases, the end composition may be selected from the range from 0.2 to 0.32 in case of the $Al_xGa_{1-x}As$/GaAs HJ-FET.

A HJ-FET having an $Al_{0.3}Ga_{0.7}As$/GaAs superlattice structure according to the above embodiment was made with a gate length 0.3 μm, and a gate width 200 μm. The device performances of this HJ-FET were measured. The source resistance was 0.5 Ω.mm. The mutual conductance was 350 mS/mm. As the characteristics at high frequencies, the noise figure NF was 0.7 dB and the gain G was 13 dB at 12 GHz, and NF=1.0 dB and G=10 dB at 18 GHz.

Although the above embodiment has been described on the $Al_xGa_{1-x}As$/GaAs superlattice, the embodiment is not limited to this combination and may be similarly applied to other combination of materials such as $In_xGa_{1-x}As$/GaAs, $In_xGa_{1-x}As$/$Al_yGa_{1-y}As$, etc. In case of using $In_xGa_{1-x}As$, the channel layer which forms a two-dimensional electron gas is preferably formed of an $In_zGa_{1-z}As$ ($0 < Z < 0.2$) layer, instead of the undoped GaAs layer 2 of the above-described structure. Further high performance of the device can be expected due to the higher electron mobility and the higher saturation velocity which are ascribed to a smaller effective mass of electron compared to the case of using GaAs.

Figure 9:
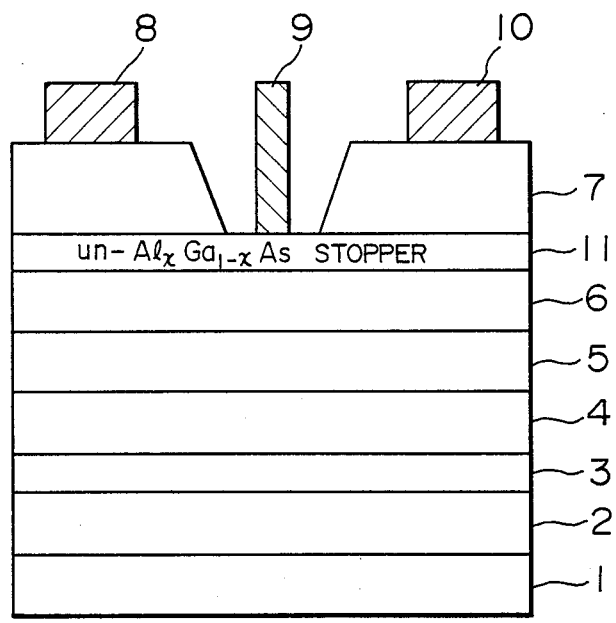
FIG. 9 is a cross-sectional view of a heterojunction field effect transistor according to another embodiment of this invention.

Another embodiment will be described, referring to FIG. 9. In this embodiment, the recess etching for forming a gate electrode is performed through selective dry etching. In case of GaAs/$Al_xGa_{1-x}As$ system, the selective dry etching can be performed through the use of $CCl_2F_2$+He gas. An undoped $Al_xGa_{1-x}As$ stopper layer 11 (x=0.2-0.32) having a thickness of not less than 1.5 nm and not more than 5 nm is inserted between the superlattice layer 6 and the $n^+$-type GaAs layer 7 to serve as an etching stopper for the dry etching process. Other details of this embodiment may be similar to those of FIG. 5A.

Cases where the cell temperatures of the molecular beam sources are kept constant have been described hereinabove. The cell temperature for an element or elements, the composition of which is to be varied, can also be varied. Namely, the cell temperature of a particular molecular beam source or sources can be lowered by natural cooling, while the film thickness ratio is also varied by controllably closing the cell shutter. A steeper or finer composition variation can be achieved by epitaxially growing a superlattice structure through thus combining two kinds of composition control.

Figure 2:
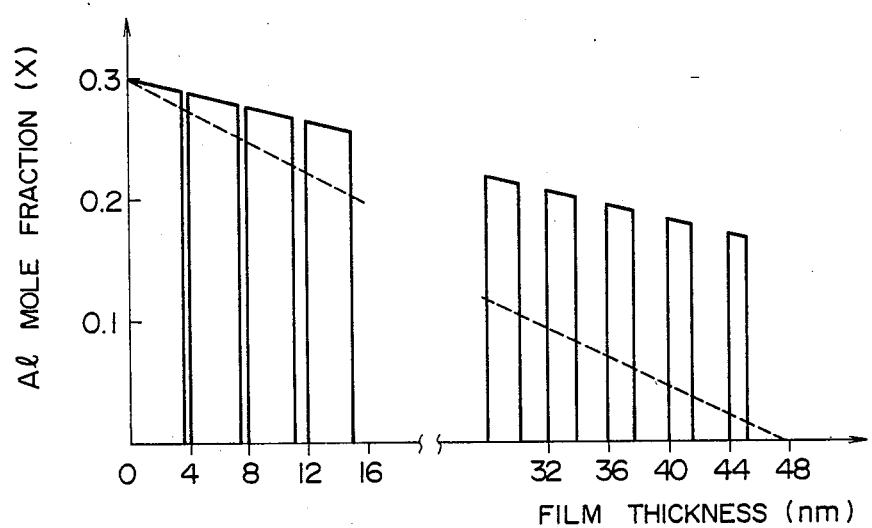
FIG. 2 is a graph showing a composition distribution in a superlattice structure in the direction of film thickness, according to another embodiment of this invention.
Figure 3:
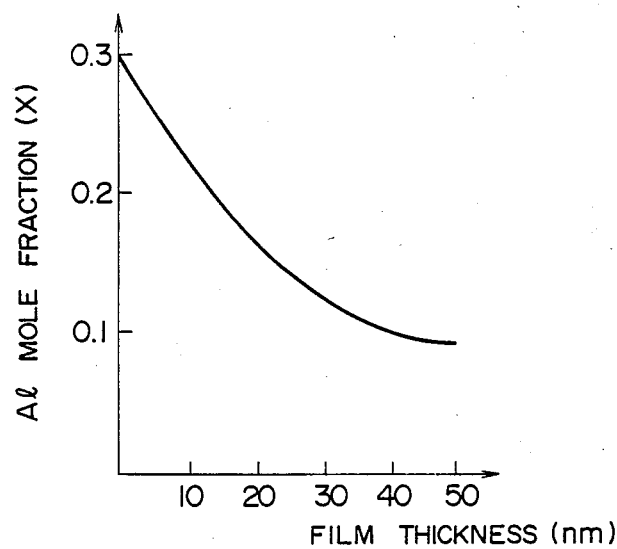
FIG. 3 is a graph showing a composition distribution in a grown crystal layer in the direction of film thickness, according to the prior art utilizing natural cooling.
Figure 4:
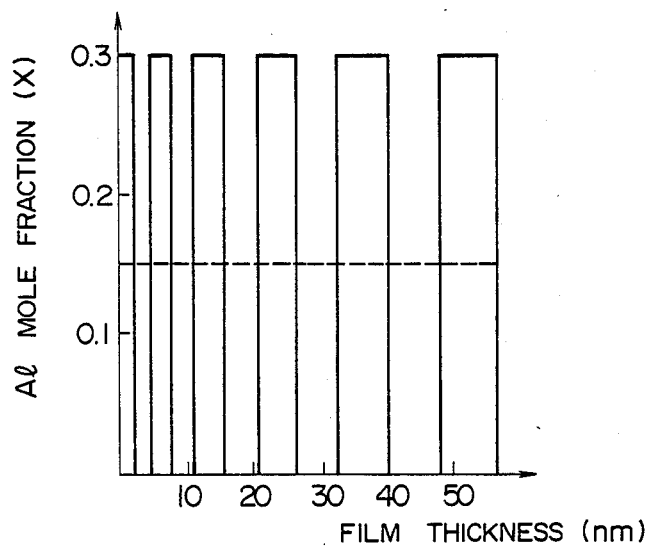
FIG. 4 is a graph showing a composition distribution in a superlattice structure in the direction of film thickness, according to the prior art.

FIG. 2 shows, as an example, the relation between the Al mole fraction and the film thickness of a semiconductor epitaxial crystal of $Al_xGa_{1-x}As$ having a superlattice structure prepared by lowering the temperature of molecular beam source for the element whose mole fraction is to be varied and controlling the time interval of opening and closing the shutter of the Al molecular beam source.

The cell temperatures of the Al, Ga, and As sources are initially set to grow $Al_{0.3}Ga_{0.7}As$. First, an $Al_{0.3}Ga_{0.7}As$ layer is grown as an underlie.

Then, a superlattice is grown. Selecting the unit interval of the superlattice similar to that of FIG. 1, each pair of a composition A layer containing Al and a composition B layer not containing Al is grown. The thickness ratio of the A layer to the sum thickness in the unit interval is gradually varied and the temperature of Al cell was lowered by natural cooling to reduce the Al vapor pressure.

By repeating the above procedure for twelve times, there is obtained a thin film, about 50 nm in thickness, of $Al_xGa_{1-x}As$ with gradually varying average Al mole fraction. Subsequently, a continuous crystal growth with the Al cell shutter being closed is done to form a GaAs layer. The solid line represents Al mole fraction in the as-grown crystal. It is shown that, owing to the decrease in Al vapor pressure from the Al molecular beam source due to temperature lowering of the Al cell, the Al mole fraction in $Al_xGa_{1-x}As$ in the state where Al cell shutter is opened, decreases. A more rapidly graded composition distribution than that of FIG. 1 is obtained by lowering the cell temperature of the Al cell in addition to increasing the closed-shutter time period for the Al cell. The average composition in the superlattice structure is shown by a broken line.

An $Al_xGa_{1-x}As$ layer with a graded Al composition where x varies from 0.3 to 0.0 was obtained in a thin layer of 50 nm through the above process. In producing a thinner film with similarly graded Al mole fraction, it becomes necessary to reduce the rate of growth. Then, it may be required to decrease the cell temperatures. It is to be noted, however, that the grown layer becomes more sensitive to the residual gas such as oxygen and that it is necessary for forming a high quality film to increase the vacuum in the growth chamber in proportion to the decrease in growth rate.

Further, short time or rapid annealing may be done to cause Al atom to diffuse and distribute as shown by broken line, resulting in really smoothly and continuously graded Al mole fraction. Here, the "short time" or "rapid" annealing is the annealing at an increased temperature in a reduced time period, i.e. within about several tens of seconds, compared to the usual annealing, e.g. for tens of minutes.

In a rapid annealing, the superlattice film containing Si as dopant is subjected to heat treatment at 800° C. for 30 seconds. After annealing the Al mole fraction itself becomes smoothly graded, as shown by the broken line in FIG. 2.

For smoothing the Al composition itself, it is necessary to diffuse Al atoms from the Al-containing films to Al-not-containing films sufficiently. The annealing time can be curtailed by decreasing the unit time span of shutter operation, shorter than the above-described 30 seconds.

Further, it has been found that the Al diffusion is facilitated by the diffusion of the conductivity-affording impurity such as Si or Ge.

In forming an undoped layer with graded mole fraction, there is no diffusion of dopant during annealing in the above said condition and, hence, the diffusion of Al by annealing becomes more difficult. In this case, it is necessary to anneal at 900° C. for 10 minutes or more.

As described above, annealing conditions differ depending on whether a dopant is present or not. In a selectively doped heterojunction device, the distribution of a doped region can be made smoothly graded by annealing, while an undoped portion may remain in a superlattice state which has a gradually graded average composition.

As described above, it is possible to form a compound semiconductor superthin film with an effectively graded mole fraction by MBE and, when desired, to make the mole fraction itself to be smoothened to realize a really smoothly graded distribution by annealing.

What is claimed is:

1. A compound semiconductor structure comprising:
   a first and a second uniform composition layer having a first and a second uniform composition, respectively;
   a superlattice structure disposed between and first and second uniform composition layers, and comprising a plurality of alternating first layers containing an element as a constitutent and second layers not containing said element, adjacent first and second layers forming pairs with such thickness ratio that varies gradually and monotonically in the direction of film thickness throughout successive pairs, with one of the pair of first and second layers adjacent the first uniform composition layer being thicker than the other of the pair, and one of the pair of first and second layers adjacent the second uniform composition layer being thicker than the order of the pair; and
   the first and second uniform composition layers having conduction bands substantially equal to those of the thicker one of the first and the second layers in the adjacent pair.

2. A compound semiconductor structure according to claim 1, wherein the first and second layers of the superlattice structure are undoped and highly doped, respectively.

3. A compound semiconductor structure according to claim 1, wherein the first uniform composition layer comprises a pair of sub-layers, spaced from each other by a spacing, formed on the superlattice structure, the second uniform composition layer being provided under the superlattice structure, the compound semiconductor structure further comprising a pair of current terminals formed respectively on said sub-layers of the first uniform composition layer, a control terminal provided on the superlattice structure in the spacing between the sub-layers of the first uniform composition layer, and a hetero-junction channel region formed under the second uniform composition layer, the superlattice structure serving to electrically connect said pair of current terminals with said channel region nd the semiconductor structure constituting a hetero-junction field-effect transistor.

4. A compound semiconductor structure according to claim 1, wherein the sum of the thicknesses of each pair of first and second layers is constant.

5. A compound semiconductor structure according to claim 4, wherein the thickness ratio varies from 1 to 0, from one pair of first and second layers adjacent one of the first and second uniform composition layers, to another pair of first and second layers adjacent the other one of the first and second uniform composition layers.

6. A compound semiconductor structure according to claim 1, wherein the sum of the thickness of each pair of first and second layers is at most 4 nm, but greater than 0.

7. A compound semiconductor structure according to claim 1, wherein the thickness ratio varies from 1 to 0, from one pair of first and second layers adjacent one of the first and second uniform composition layers, to another pair of first and second layers adjacent the other one of the first and second uniform composition layers.

8. A compound semiconductor structure according to claim 3, wherein the pair of sub-layers of the first uniform composition layer are highly doped so aa to form ohmic contact with the pair of current terminals.

9. A hetero-junction field effect transistor comprising:
   a superlattice structure including pairs of a first layer formed of a first semiconductor composition, and a second layer formed of a second semiconductor composition, each of said pairs having a ratio of the thickness of the first layer to the thickness of the second layer, the thickness ratio being gradually and monotonically varied in said pairs;
   a first uniform composition semiconductor layer disposed under said superlattice structure, and a pair of second uniform composition semiconductor layers provided on the superlattice structure and spaced from each other by a spacing one of the pairs of first and second layers being closest to the first uniform composition layer and another of the pairs of first and second layers being closest to the second uniform composition layer, one of the first and second layers of each of the one pair and the another pair being thicker than the other of the first and second layers of each of the one pair and the another pair, respectively, the first and the second uniform composition layers having a composition respectively substantially equal to the semiconductor composition of the one of the first and second layers, of the pair of first and second layers closest respectively to the first and second uniform composition layers, that is thicker;

a third semiconductor layer, disposed under said first uniform composition semiconductor layer;

a hetero-junction channel region disposed in said third semiconductor layer;

a pair of current terminals disposed on said second uniform composition semiconductor layer; and a control terminal disposed on said superlattice structure in the spacing between the pair of second uniform composition semiconductor layers, to control two-dimensional carriers in said hetero-junction channel region.

10. A hetero-junction field effect transistor according to claim 9, further comprising a thin semiconductor layer disposed between (1) said superlattice structure and (2) said pair of second uniform composition semiconductor layers and the control terminal, said thin semiconductor layer being capable of stopping dry etching of said pair of second uniform composition semiconductor layers.

11. A hetero-junction field-effect transistor according to claim 9, further comprising a fourth semiconductor layer disposed between the third semiconductor layer and the first uniform composition semiconductor layer, the fourth semiconductor layer being undoped and of the same composition as the first uniform composition semiconductor layer, with a hetero-junction being formed between the fourth semiconductor layer and the third semiconductor layer.

12. A hetero-junction field-effect transistor according to claim 11, wherein said first uniform composition semiconductor layer is highly doped.

13. A compound semiconductor structure comprising:

first and second uniform composition layers having first and second uniform compositions, respectively;

a structure disposed between said first and second uniform composition layers, formed by (1) forming a superlattice structure comprising a plurality of alternating first layers containing an element as a constituent and second layers not containing said element, adjacent first and second layers forming pairs with such thickness ratio that varies gradually and monotonically in the direction of film thickness throughout successive pairs, and (2) annealing the superlattice structure so as to diffuse said element and provide a smoothly and continuously graded mole fraction of said element in the direction of film thickness; and the first and second uniform composition layers having conduction bands substantially equal to those of portions of said structure respectively adjacent thereto.

14. A hetero-junction field effect transistor comprising:

a single crystalline compound semiconductor substrate of a first composition;

an undoped compound semiconductor layer of said first composition, formed on said compound semiconductor substrate;

an undoped compound semiconductor layer of a second composition, formed on said undoped compound semiconductor layer of said first composition;

a highly doped compound semiconductor layer of said second composition, formed on said compound semiconductor layer of said second composition;

a superlattice structure, including a plurality of alternating first compound semiconductor layers of said first composition and second compound semiconductor layers of said second composition, formed on said highly doped compound semiconductor layer of said second composition;

highly doped compound semiconductor layers of said first composition, formed on said superlattice structure, said highly doped compound semiconductor layers of said first composition being spaced apart from each other by a spacing;

source and drain electrodes respectively formed on said highly doped compound semiconductor layers of said first composition; and a gate electrode formed on an exposed upper surface of said superlattice structure, in the spacing between said highly doped compound semiconductor layers of said first composition, wherein the ratio (A/B) of the thickness (A) of said first compound semiconductor layer to that (B) of said second compound semiconductor layer decreases in a direction towards said compound semiconductor substrate.

15. A hetero-junction field effect transistor according to claim 14, wherein said first composition and said second composition are GaAs and $Al_xGa_{1-x}As$, respectively.

16. A hetero-junction field effect transistor according to claim 15, wherein said $Al_xGa_{1-x}As$ is $Al_{0.3}Ga_{0.7}As$.

17. A hetero-junction field effect transistor according to claim 14, wherein said superlattice structure comprises a highly doped portion and an undoped portion formed thereon.

18. A hetero-junction field effect transistor according to claim 14, wherein a second undoped compound semiconductor layer, of said second composition, is formed on said superlattice structure, and said highly doped compound semiconductor layer of said first composition and said gate electrode are formed thereon.

19. A hetero-junction field effect transistor according to claim 18, wherein said second undoped compound semiconductor layer comprises an undoped $Al_xGa_{1-x}As$ film.

* * * * *